(12) United States Patent
Kronholz et al.

(10) Patent No.: US 8,835,209 B2
(45) Date of Patent: Sep. 16, 2014

(54) COMPLEMENTARY TRANSISTORS COMPRISING HIGH-K METAL GATE ELECTRODE STRUCTURES AND EPITAXIALLY FORMED SEMICONDUCTOR MATERIALS IN THE DRAIN AND SOURCE AREAS

(75) Inventors: Stephan Kronholz, Dresden (DE); Gunda Beernink, Dresden (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/370,944

(22) Filed: Feb. 10, 2012

(65) Prior Publication Data

US 2012/0211838 A1 Aug. 23, 2012

(30) Foreign Application Priority Data

Feb. 17, 2011 (DE) .......................... 10 2011 004 320

(51) Int. Cl.
*H01L 21/00* (2006.01)
*H01L 21/70* (2006.01)
*H01L 21/8238* (2006.01)

(52) U.S. Cl.
CPC *H01L 21/823807* (2013.01); *H01L 21/823814* (2013.01)
USPC ........................................... 438/69; 257/369

(58) Field of Classification Search
USPC ........... 257/19, 190, 288, 392, 351, 347, 402, 257/408, 368, 230, 407, 48, 350, 369; 438/14, 275, 478, 492, 218, 288–289, 438/199, 216
See application file for complete search history.

(56) References Cited

U.S. PATENT DOCUMENTS

| | | | |
|---|---|---|---|
| 6,261,887 B1 | 7/2001 | Rodder | 438/218 |
| 7,579,262 B2 * | 8/2009 | Hoentschel et al. | 438/478 |
| 2006/0131665 A1 * | 6/2006 | Murthy et al. | 257/384 |
| 2007/0048907 A1 * | 3/2007 | Lee et al. | 438/142 |
| 2008/0182075 A1 | 7/2008 | Chopra et al. | 428/172 |
| 2009/0294801 A1 * | 12/2009 | Harley et al. | 257/192 |
| 2010/0164020 A1 * | 7/2010 | Kronholz et al. | 257/408 |
| 2012/0001238 A1 * | 1/2012 | Tsai et al. | 257/255 |

FOREIGN PATENT DOCUMENTS

DE 102006015090 A1 10/2007 .......... H01L 21/8234

OTHER PUBLICATIONS

Translation of Official Communication from German Patent Office for German Patent Application No. 10 2011 004 320.9 dated Jan. 4, 2012.

* cited by examiner

*Primary Examiner* — Julio J Maldonado
*Assistant Examiner* — Moin Rahman
(74) *Attorney, Agent, or Firm* — Amerson Law Firm, PLLC

(57) ABSTRACT

When forming sophisticated semiconductor devices including complementary transistors having a reduced gate length, the individual transistor characteristics may be adjusted on the basis of individually provided semiconductor alloys, such as a silicon/germanium alloy for P-channel transistors and a silicon/phosphorous semiconductor alloy for N-channel transistors. To this end, a superior hard mask patterning regime may be applied in order to provide compatibility with sophisticated replacement gate approaches, while avoiding undue process non-uniformities, in particular with respect to the removal of a dielectric cap layer.

24 Claims, 5 Drawing Sheets

COMPLEMENTARY TRANSISTORS COMPRISING HIGH-K METAL GATE ELECTRODE STRUCTURES AND EPITAXIALLY FORMED SEMICONDUCTOR MATERIALS IN THE DRAIN AND SOURCE AREAS

BACKGROUND OF THE INVENTION

1. Field of the Invention

Generally, the present disclosure relates to the fabrication of highly sophisticated integrated circuits including complementary transistors, i.e., N-channel transistors and P-channel transistors, that comprise a high-k metal gate electrode structure in combination with epitaxially grown materials, such as strain-inducing semiconductor alloys, formed in the drain and source areas.

2. Description of the Related Art

The fabrication of advanced integrated circuits, such as CPUs, storage devices, ASICs (application specific integrated circuits) and the like, requires a very large number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, CMOS technology is one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, most of the integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different silicon regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide has been preferably used as a base material for gate insulation layers that separate the gate electrode, frequently made of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling in combination with sophisticated lateral and vertical dopant profiles in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. That is, conventionally, the thickness of the silicon dioxide layer has been correspondingly reduced to provide the required capacitance between the gate electrode and the channel region. For example, a channel length of approximately 0.08 µm may require a gate dielectric made of silicon dioxide as thin as approximately 1.2 nm. The relatively high leakage current caused by the direct tunneling of charge carriers through an ultra-thin silicon dioxide gate insulation layer may, therefore, reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher, may be used, for instance, in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials in combination with the high-k dielectric material. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided.

The process of fabricating a sophisticated gate electrode structure on the basis of a high-k dielectric material may require a moderately complex process sequence in order to adjust an appropriate work function for the transistors of different conductivity type and due to the fact that high-k dielectric materials may typically be very sensitive when exposed to certain process conditions, such as high temperatures in the presence of oxygen and the like. Therefore, different approaches have been developed, one of which, referred to as replacement gate approach, includes processing the semiconductor devices with a high degree of compatibility with standard process techniques, wherein the typical electrode material polysilicon may be replaced in a very advanced manufacturing stage with appropriate metals for adjusting the work function of the different transistors and providing a highly conductive electrode metal.

In addition to providing sophisticated gate electrode structures, transistor performance may also be significantly enhanced by using a strain component in the channel region of at least one type of transistor, such as in P-channel transistors. It is well known that providing a compressive strain component along the current flow direction in a silicon channel region having a standard crystalline configuration may result in superior mobility of holes in the channel region, thereby also improving the drive current capability of the P-channel transistor. For this reason, a plurality of strain-inducing mechanisms have been developed, wherein one promising approach may be based on a strain-inducing semiconductor alloy, which is embedded into the active region of P-channel transistors after patterning the gate electrode structure. To this end, cavities may be formed in the active region laterally adjacent to the gate electrode structure and the cavities are subsequently refilled with a strain-inducing semiconductor alloy, such as a silicon/germanium material, which is grown in a strained state that in turn induces a desired compressive strain component in the channel region. The strain-inducing silicon/germanium material may be deposited on the basis of selective epitaxial growth techniques, in which process parameters are adjusted such that significant material deposition is restricted to crystalline silicon areas, while any material deposition on dielectric surface areas is suppressed. In order to avoid undue material growth on the gate electrode structures, the polysilicon material has to be reliably confined at least during the selective epitaxial growth process. For this purpose, the gate electrode structures are typically provided with a dielectric cap material, such as a silicon nitride material, and a silicon nitride spacer layer is typically provided so as to cover the N-channel transistors, while the silicon nitride spacer layer is patterned into sidewall spacer elements at the gate electrode structure of the P-channel transistor, wherein, in the same etch sequence, the corresponding cavities are also formed in the active region of the P-channel transistor.

Since the dielectric cap material has to be removed in a later manufacturing stage, i.e., during the replacement gate approach in order to expose the placeholder polysilicon material, which is typically accomplished by performing a complex planarization process based on chemical mechanical polishing (CMP) recipes, any asymmetry introduced during the overall process flow with respect to the exposure of the dielectric cap layers of P-channel transistors and N-channel transistors may also result in significant variabilities upon performing the replacement gate approach. For example, a significantly different thickness of the dielectric cap layer, which may be caused by the incorporation of the strain-inducing semiconductor material selectively in the P-channel transistor, may, therefore, result in pronounced irregularities upon exposing the polysilicon material during the replacement gate approach. For example, minute silicon nitride residues or any other dielectric residues that may still be present on top of the polysilicon material in some gate electrode structures may also lead to an incomplete removal of the polysilicon material, thereby significantly altering the characteristics of the resulting high-k metal gate electrode structures.

Moreover, upon further reducing the overall transistor dimensions, any performance-enhancing mechanisms, such as the strain-inducing semiconductor alloy provided in the P-channel transistors, may have an increased effect on the overall transistor performance. Therefore, the strain-inducing efficiency in the P-channel transistor is typically increased, for instance, by increasing the germanium concentration, reducing the lateral offset of the strain-inducing silicon/germanium material from the channel region and the like, wherein, however, any such efficient mechanisms for enhancing performance are not available for N-channel transistors, or any such mechanisms are significantly less efficient. Consequently, it has been proposed to enhance characteristics of N-channel transistors by providing a semiconductor alloy, for instance on the basis of a silicon/phosphorous composition, in order to provide overall superior electronic characteristics, for instance with respect to conductivity and the like. To this end, selective epitaxial growth techniques may be applied at any appropriate manufacturing stage, wherein, however, presently available process strategies may result in even increased non-uniformities between N-channel transistors and P-channel transistors, for instance, with respect to applying a replacement gate approach by efficiently exposing the placeholder polysilicon material.

In view of the situation described above, the present disclosure relates to manufacturing techniques and semiconductor devices in which a strain-inducing semiconductor material may be efficiently incorporated in P-channel transistors, whereas an appropriate semiconductor alloy may be incorporated into the N-channel transistors, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which performance of complementary transistors, i.e., of N-channel transistors and P-channel transistors, may be enhanced by providing appropriate semiconductor alloys for each type of transistor while nevertheless implementing a highly symmetric manufacturing flow, for instance, with respect to the encapsulation of gate electrode structures prior to performing a replacement gate approach, thereby also reducing any non-uniformities of the resulting transistor devices. To this end, appropriate hard mask layers may be applied in order to enable the incorporation of a strain-inducing semiconductor material in the P-channel transistor, for instance, based on any appropriately shaped cavities, while efficiently covering the N-channel transistor, followed by a further process sequence in which the P-channel transistor may be efficiently covered by an appropriate hard mask material while forming a desired semiconductor alloy in the N-channel transistor. In other cases, the above-described order of process sequences may be reversed, while nevertheless achieving the superior symmetric process flow. The hard mask layers used for selectively providing the desired semiconductor alloys for the complementary transistors may have a significantly different etch behavior, for instance, compared to any dielectric cap layers or layer systems which are used for efficiently encapsulating the gate electrode structures. Hence, the corresponding hard mask materials may be efficiently removed selectively with respect to the gate electrode structures, substantially without unduly affecting the integrity of the encapsulation. Therefore, the further processing may be continued on the basis of a substantially symmetric configuration of at least the encapsulated gate electrode structures, thereby also achieving superior process uniformity upon performing a replacement gate approach.

One illustrative method disclosed herein comprises forming a first hard mask layer above a first gate electrode structure and a second gate electrode structure, wherein the first gate electrode structure is formed on a first active region of a semiconductor device and the second gate electrode structure is formed on a second active region. The method further comprises forming a first spacer structure from the first hard mask layer on sidewalls of the first gate electrode structure while preserving the first hard mask layer above the second gate electrode structure and the second active region. Additionally, a first semiconductor alloy is formed in the first active region by using the first spacer structure and the preserved first hard mask layer as a first mask. Moreover, a second hard mask layer is formed above the first and second gate electrode structures and the first and second active regions. The method further comprises forming a second spacer structure from the second hard mask layer on sidewalls of the second gate electrode structure while preserving the second hard mask layer above the first gate electrode structure and the first active region. Additionally, the method comprises forming a second semiconductor alloy in the second active region by using the second spacer structure and the preserved second hard mask layer as a second mask.

A further illustrative method disclosed herein relates to forming a semiconductor device. The method comprises forming a first gate electrode structure above a first semiconductor region and a second gate electrode structure above a second semiconductor region, wherein the first and second gate electrode structures comprise a placeholder electrode material and a dielectric cap layer formed thereon. The method further comprises forming a strain-inducing semiconductor material in the first semiconductor region while masking the second semiconductor region with a first hard mask layer. Moreover, the first hard mask layer is removed from above at least a portion of the second semiconductor region. The method additionally comprises forming a semiconductor alloy on the second semiconductor region while masking the first semiconductor region with a second hard mask layer. Moreover, the method comprises replacing the placeholder electrode material of the first and second gate electrode structures, at least with a metal-containing electrode material.

One illustrative semiconductor device disclosed herein has a first gate electrode structure formed on an active region of a P-channel transistor and comprising a high-k dielectric material and an electrode metal. The semiconductor device further has a second gate electrode structure formed on an active region of an N-channel transistor and comprising the high-k dielectric material and the electrode metal. Moreover, the semiconductor device has a strain-inducing first semiconductor alloy that is formed in the active region of the P-channel transistor and which extends to a first depth. Furthermore, a second semiconductor alloy is formed in the active region of the N-channel transistor and extends to a second depth that is less than the first depth.

In some illustrative embodiments, the first semiconductor alloy comprises at least one of silicon, germanium and tin, while the second semiconductor alloy comprises phosphorous.

BRIEF DESCRIPTION OF THE DRAWINGS

The disclosure may be understood by reference to the following description taken in conjunction with the accompanying drawings, in which like reference numerals identify like elements, and in which.

Figure 1A:
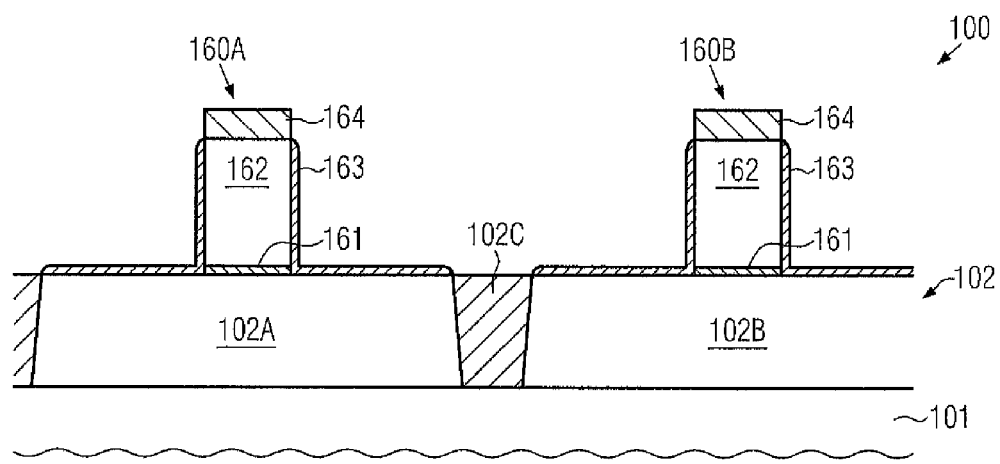
FIGS. 1a-1i schematically illustrate cross-sectional views of a semiconductor device during various manufacturing stages in providing semiconductor alloys selectively in N-channel transistors and P-channel transistors, respectively, by using a superior hard mask regime, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques and semiconductor devices in which sophisticated high-k metal gate electrode structures may be formed on the basis of a replacement gate approach, while, additionally, semiconductor alloys may be selectively provided for N-channel transistors and P-channel transistors without unduly affecting the further processing and, in particular, the exposure and replacement of a polysilicon material or any other placeholder material of the gate electrode structures in a very advanced manufacturing stage. To this end, a hard mask regime may be applied in which a high degree of "symmetry" with respect to exposure of the encapsulated gate electrode structure to reactive etch atmospheres may be preserved in order to provide superior uniformity of the resulting device configuration upon performing a replacement gate approach. For example, the thickness of the dielectric cap layer or cap layer system may exhibit a superior uniformity during the entire process compared to conventional strategies, thereby achieving superior uniformity upon exposing the placeholder gate electrode material. Moreover, the dielectric cap layer having the superior uniformity with respect to N-channel transistors and P-channel transistors may also be efficiently used in sophisticated contact regimes in which self-aligned contact elements are to be formed prior to performing a replacement gate approach.

In other illustrative embodiments, the dielectric cap layers may be removed at any appropriate manufacturing stage prior to completing the basic transistor configuration if the presence of the dielectric cap layer during or prior to performing the replacement gate approach is not necessary. Also in this case, the superior uniformity obtained by the hard mask regime providing superior etch selectivity may result in enhanced overall process efficiency and may thus reduce any transistor variability of sophisticated complementary transistors.

The hard mask regime may be based, in some illustrative embodiments, on a silicon dioxide material, thereby enabling application of highly selective etch recipes for forming cavities in non-masked active regions of transistors and for acting as an efficient deposition mask. For example, upon forming cavities, for instance, in the P-channel transistors, hydrogen bromide may be used in plasma-assisted etch recipes so as to remove the silicon material of exposed active regions, thereby reducing any undue material loss of the dielectric cap layer of the non-masked gate electrode structures. After forming the cavities and after selectively depositing the strain-inducing semiconductor material in the cavities, the hard mask material may also be removed on the basis of a highly selective etch recipe so that, after the removal of the mask material, the gate electrode structures may still have a very similar configuration, in particular with respect to the thickness of the dielectric cap layer. Thereafter, a further hard mask layer may be applied in order to selectively form a second semiconductor alloy, for instance, for enhancing performance of N-channel transistors by depositing an appropriate material, for example, a silicon/phosphorous material, which may provide superior electronic characteristics. Moreover, the material may be deposited into any recesses, if considered appropriate, which may also be formed on the basis of the hard mask material without unduly affecting the dielectric cap layer, while any other transistors are still reliably covered by the remaining preserved hard mask layer. Thereafter, the further hard mask material may be efficiently removed, as described above. Consequently, the processing of the semiconductor device may be continued on the basis of superior process conditions, i.e., on the basis of very similar gate electrode stacks, thereby achieving superior uniformity of the final characteristics of the complementary transistors.

For instance, the dielectric cap material may be removed at any appropriate manufacturing stage, for instance, prior to completing the basic transistor structure, if the presence of the dielectric cap layers is no longer required during the further processing. In other illustrative embodiments, the dielectric cap layers may be efficiently removed on the basis of an appropriate material removal process, such as a polishing process, in a very advanced manufacturing stage, i.e., after completing the basic transistor structure, when applying a replacement gate approach. In this case, the dielectric cap layers may be efficiently used as etch stop materials in illustrative embodiments in which a contact process may be applied prior to actually replacing the placeholder material of the gate electrode structures with a sophisticated material system. For example, the dielectric cap materials may enable a selective removal of an interlayer dielectric material in order to expose drain and source areas in a substantially self-aligned manner, thereby also providing the possibility of depositing an appropriate contact metal without requiring sophisticated lithography processes, as are typically required in sophisticated semiconductor devices.

In some illustrative embodiments, the patterning of the hard mask materials may be accomplished on the basis of a plasma-assisted etch technique in order to reduce material erosion, which is typically caused by wet chemical etch recipes, so that undue material erosion in isolation structures and the like may be avoided.

FIG. 1 a schematically illustrates a cross-sectional view of the semiconductor device 100 in a manufacturing stage in which gate electrode structures 160A, 160B are provided on respective active regions 102A, 102B. The active regions 102A, 102B are to be understood as semiconductor regions formed in a semiconductor layer 102, which in turn may be formed above a substrate 101, which may represent any appropriate carrier material for forming thereon or thereabove a semiconductor material. It should be appreciated that the semiconductor layer 102, which may be made of an appropriate base material, such as silicon, may represent a substantially continuous semiconductor material in an initial stage of the manufacturing process and may be divided into a plurality of active or semiconductor regions, such as the regions 102A, 102B, by providing respective isolation regions or structures 102C. The isolation structure 102C may be provided in the form of a shallow trench isolation in sophisticated applications. In the embodiment shown, the active region 102A may correspond to a P-channel transistor, while the active region 102B may correspond to an N-channel transistor of the device 100. Generally, an active region is to be understood as a semiconductor region in and above which one or more transistors are to be formed. For convenience, in the embodiment shown, a single transistor is to be formed in each of the active regions 102A, 102B.

In this manufacturing stage, the gate electrode structures 160A, 160B may have essentially the same configuration and may have a dielectric layer 161, such as a silicon dioxide-based material and the like, followed by a placeholder electrode material 162, such as a silicon material in an amorphous and/or polycrystalline state. Furthermore, a dielectric cap layer or layer system 164 may be formed above the placeholder material 162 and may include, in some illustrative embodiments, at least a significant amount of silicon nitride material. It should be appreciated that any additional material layers, such as silicon dioxide and the like, may also be incorporated in the layer or layer system 164. Additionally, a spacer or liner structure 163 may be formed on sidewalls of the electrode material 162 and on exposed portions of the active regions 102A, 102B.

As discussed above, in sophisticated semiconductor devices, a gate length, i.e., in FIG. 1a, the horizontal extension of the placeholder material 162 at an interface formed between the material 162 and the material 161, may be 30 nm and less, thereby requiring sophisticated electronic characteristics of the gate electrode structures 160A, 160B which may be obtained by replacing at least the material 162 in a very advanced manufacturing stage.

The semiconductor device 100 as shown in FIG. 1a may be formed on the basis of the following processes. Prior to or after forming the isolation structure 102C, which may be accomplished by applying sophisticated lithography, etch, deposition, planarization and anneal techniques, the basic doping, such as a well doping, may be incorporated into the active regions 102A, 102B on the basis of an appropriate implantation sequence in combination with an associated masking strategy. Thereafter, appropriate materials, such as the dielectric material 161, the placeholder material 162 and one or more materials for the cap layer 164, may be deposited, for instance, on the basis of well-established oxidation and deposition techniques. It should be appreciated that any further sacrificial materials, such as anti-reflective coating (ARC) materials, further hard mask materials and the like may be provided so as to perform the complex patterning sequence, which may frequently include two different lithography steps in order to pattern a corresponding mask material and finally the cap layer systems 164, which may then be used as a hard mask for patterning the gate electrode structures 160A, 160B so as to have the desired lateral dimensions. To this end, sophisticated etch techniques may be applied. Thereafter, the liner 163 may be formed by applying oxidation techniques and the like. In this manufacturing stage, the cap layer 164 may have a thickness of approximately 20-50 nm, depending on the overall process and device requirements.

Figure 1B:
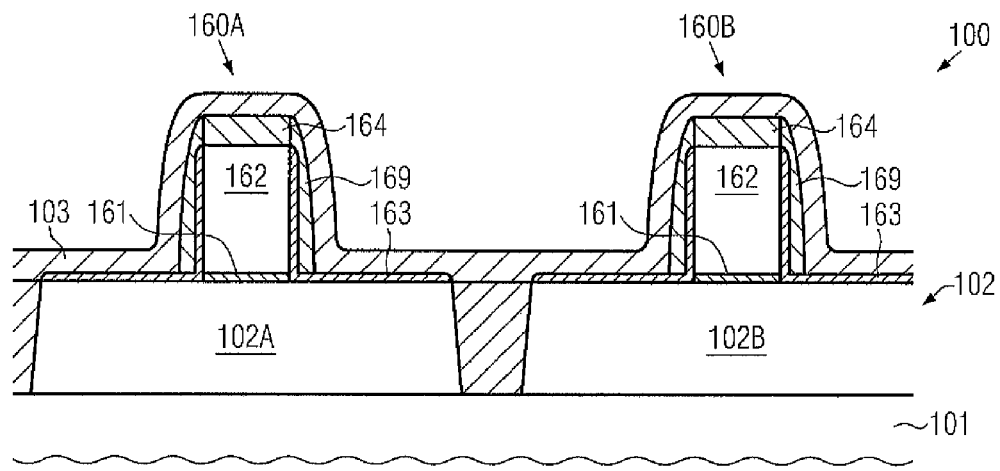

FIG. 1b schematically illustrates the semiconductor device 100 in a process stage in which a hard mask layer 103 is formed above the gate electrode structures 160A, 160B and above the active regions 102A, 102B. In one illustrative embodiment, the hard mask layer 103 is formed of a silicon dioxide material which may be formed on the basis of any well-established plasma enhanced chemical vapor deposition (CVD) technique, a thermally activated CVD process and the like. For example, the hard mask layer 103 may be provided with a thickness of approximately 15-30 nm, while other values may be selected if considered appropriate. Moreover, in the embodiment shown, additional sidewall spacers 169 may be formed on sidewalls of the gate electrode structures 160A, 160B and may be made of an appropriate material, such as silicon nitride, which may provide superior integrity of the gate electrode structures 160A, 160B upon patterning and removing the hard mask layer 103. The spacers 169 may be formed by depositing an appropriate spacer material, such as a silicon nitride layer, which may be accomplished on the basis of thermally activated CVD, plasma enhanced CVD, a combination thereof, multilayer deposition techniques and the like. Thereafter, an appropriate anisotropic etch process may be applied wherein the liner 163 may act as an efficient etch stop material. To this end, any well-established plasma assisted etch recipes may be applied.

Figure 1C:
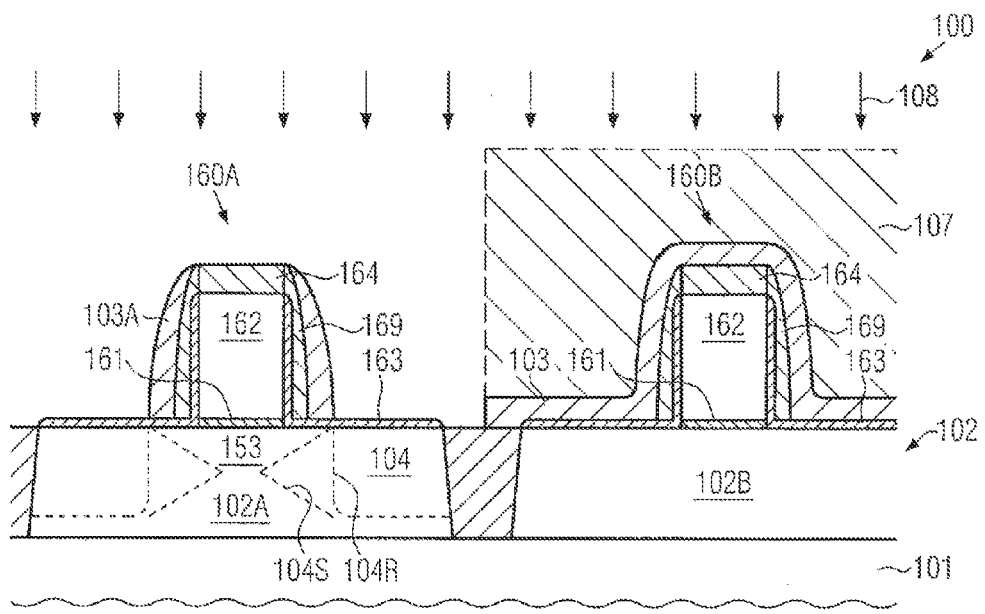

FIG. 1c schematically illustrates the device 100 in a further advanced manufacturing stage. As illustrated, the device 100 may be exposed to an etch sequence 108, which may be applied, at least initially, on the basis of an appropriate etch mask 107, such as a resist mask. Consequently, during the etch sequence 108, initially the hard mask layer 103 may be patterned so as to form corresponding spacers 103A on sidewalls of the gate electrode structure 160A, while the layer 103 is preserved above the active region 102B and also above a portion of the isolation region 102C. As discussed above, to this end, highly selective etch recipes may be applied during the sequence 108 so that integrity of the cap layer 164 of the gate electrode structure 160A may not be unduly affected during the patterning of the hard mask layer 103 and subsequently during a further etch step of the sequence 108 when etching into the active region 102A. To this end, a different etch chemistry may be selected in order to efficiently etch into the active region 102A, thereby forming cavities 104 therein. In some illustrative embodiments, the cavities 104 may be provided as substantially "box" shaped cavities, as indicated by 104R, wherein the box-like shaping may be accomplished due to the anisotropic nature of the corresponding etch process. In this case, the lateral offset of the cavity 104R from a channel region 153 is substantially determined by the spacers 103A, 169 and the effective lateral etch rate during the corresponding anisotropic etch process. In other illustrative embodiments, in addition or alternatively to applying a substantially anisotropic plasma assisted etch recipe, a certain degree of under-etching may be implemented, for instance by using anisotropic etch recipes in the form of plasma etch techniques, wet chemical etch chemistries and the like. In some illustrative embodiments, a highly controlled degree of under-etching may be achieved by using a crystallographically anisotropic etch recipe, such as TMAH (tetra methyl ammonium hydroxide) and the like, in which certain crystal planes, such as (111) planes, may act as efficient etch stop planes. For a standard crystal configuration of the active region 102A, i.e., a (100) surface orientation and with a <110>crystal axis oriented along the current flow direction, i.e., in FIG. 1c, the horizontal direction, a substantially sigma shaped cavity may be obtained in a highly controllable manner, as indicated by 104S. In still other illustrative embodiments, a single wet chemical etch process may be applied in order to form the cavities 104. Due to the high etch selectivity of the corresponding etch step for forming the cavities 104, undue material erosion of the cap layer 164 may be avoided.

Figure 1D:
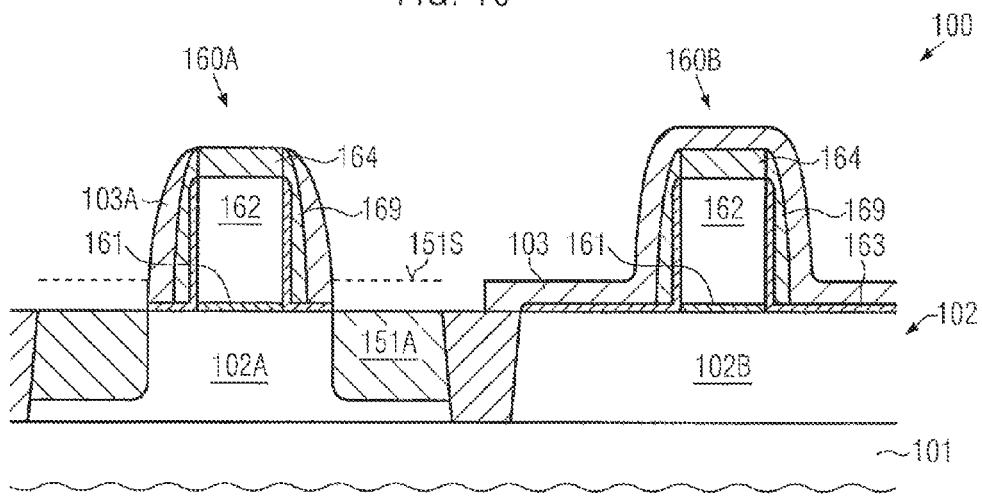

FIG. 1d schematically illustrates the device 100 in a further advanced manufacturing stage. As shown, a strain-inducing semiconductor alloy 151A may be formed in the cavities 104 by applying appropriate selective epitaxial growth techniques. In a selective epitaxial growth process, the process parameters, such as gas flow rates, temperature and the like, are appropriately selected so as to initiate a material adhesion to crystalline surface areas of appropriate crystallographic configuration only, while significant material deposition on other surface areas, such as dielectric materials, may be efficiently suppressed. To this end, appropriate cleaning recipes are typically applied so as to remove any native oxides and thereafter the actual deposition may be initiated. It should be appreciated that the hard mask layer 103, although a certain degree of material erosion may take place during the cleaning processes, may nevertheless reliably cover the active region 102B. On the other hand, exposure of the polysilicon material 162 in the gate electrode structure 160A to the selective deposition atmosphere is reliably suppressed by the cap layer 164 and the spacer 103A.

In some illustrative embodiments, the strain-inducing semiconductor material 151A may be provided in the form of a silicon/germanium material, while, in other cases, in addition to or alternatively to the germanium species, a further species of increased covalent radius, such as tin, may be incorporated, thereby providing a desired strain state while not requiring extensively high concentrations of the non-silicon species. For example, a silicon/germanium alloy may be provided with a germanium concentration of up to 30-35 percent on the basis of well-established selective deposition recipes without unduly increasing the density of lattice defects. In other cases, additional treatments may be performed so as to increase the germanium concentration in the material 151A, thereby also increasing the overall strain transfer into the active region 102A. Similarly, a silicon/germanium/tin or a silicon/tin alloy may be formed by providing appropriate precursor materials, such as tin hydride and the like. Furthermore, it should be appreciated that the concentration of the non-silicon species in the material 151A may be varied, for instance along the depth, by appropriately controlling the deposition atmosphere when a graded concentration profile is considered appropriate in the material 151A. Furthermore, a surface 151S of the material 151A may be positioned at any appropriate height level, for instance a certain degree of overflow, as indicated by the dashed line, may be implemented if considered appropriate for the further processing of the device 100.

In still other illustrative embodiments, the material 151A may be provided in the form of an in situ doped material, i.e., upon depositing the material 151A during the selective epitaxial growth process, also a dopant species such as boron may be incorporated into the resulting lattice structure, thereby obtaining a desired high dopant concentration without requiring extensive activation anneal cycles in a later manufacturing stage.

Figure 1E:
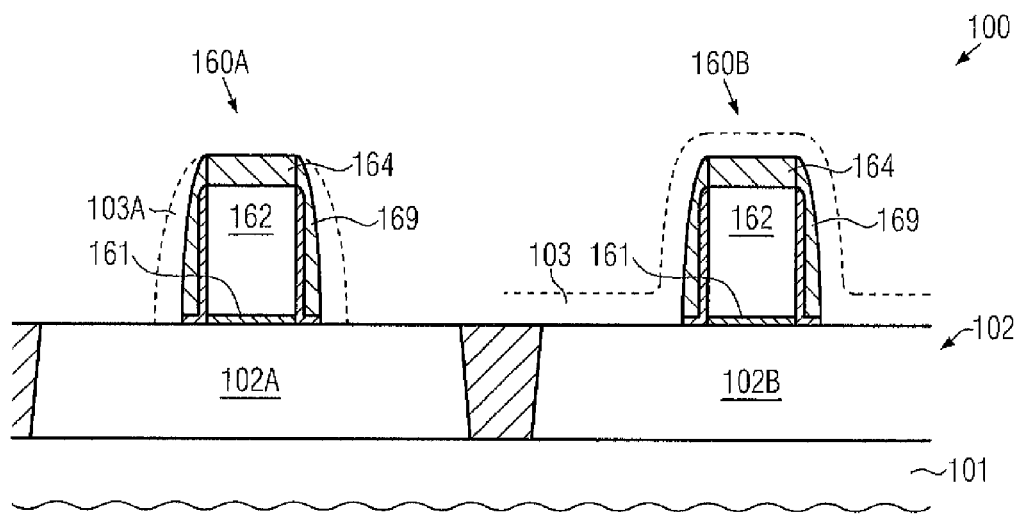

FIG. 1e schematically illustrates the device 100 in a further advanced manufacturing stage according to some illustrative embodiments in which the hard mask layer 103 may be removed from above the active region 102B. As discussed above, typically a plurality of cleaning steps may be required prior to and after forming the material 151A, which may increasingly contribute to a certain degree of material erosion in the layer 103 and possibly also in the spacer 103A. In order to provide uniform process conditions for the further processing, therefore, the layer may be removed, for instance, by highly selective wet chemical etch recipes or plasma assisted etch processes. To this end, in some illustrative embodiments, an etch mask (not shown) may be formed above the active region 102A if the spacer 103A is to be preserved. In other cases, a non-masked etch process may be applied, thereby also efficiently removing the spacer 103A. As discussed above, the corresponding material removal may be highly selective with respect to the cap layer 164, thereby avoiding undue material erosion thereof. Similarly, the spacers 169 may also provide integrity of the gate electrode structures 160A, 160B upon removing the layer 103, possibly in combination with the spacer 103A.

Figure 1F:
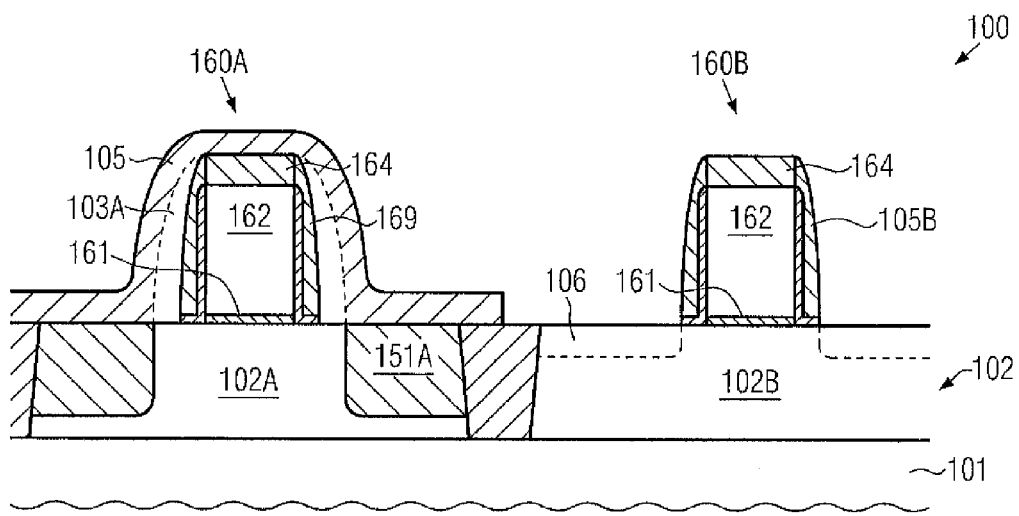

FIG. 1f schematically illustrates the semiconductor device 100 in a further advanced manufacturing stage. As shown, a further hard mask layer 105 is formed above the active region 102A and thus above the gate electrode structure 160A. Furthermore, a corresponding spacer 105B formed from the layer 105 may be formed on sidewalls of the gate electrode structure 160B. To this end, an appropriate hard mask material, for instance a silicon dioxide material providing the superior etch selectivity as discussed above, may be deposited, as is also described above with reference to FIG. 1b. Thereafter, an appropriate patterning process may be applied, as is also discussed above, thereby forming the spacer 105B while preserving the layer 105 above the active region 102A. Moreover, as described before, in some cases, the spacer 103A may still be in place, while in other cases the layer 105 may be formed directly on the spacer 169 on the gate electrode structure 160A. After the removal of any etch mask, such as a resist mask (not shown), the further processing may be continued by preparing the device 100 for a further selective epitaxial growth process. In other cases, recesses or cavities 106 may be formed in the active region 102B, if considered appropriate for the further processing. The recesses 106 may typically be formed on the basis of appropriately selected process parameters, for instance by selecting an appropriate depth that is typically different from a depth of the previously formed cavities and thus the depth of the semiconductor material 151A in the active region 102A. To this end, any appropriate etch recipe may be applied, as is also discussed above with reference to FIG. 1c when referring to the cavities 104.

Figure 1G:
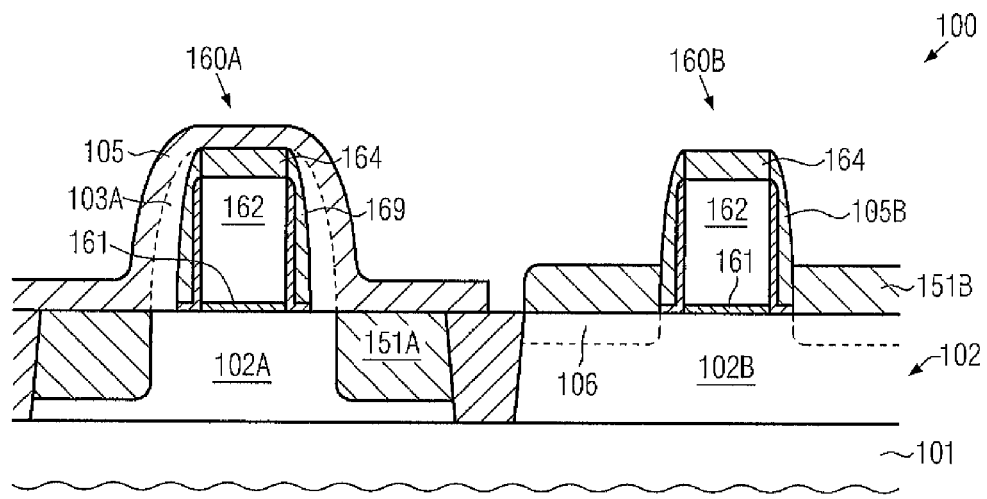

FIG. 1g schematically illustrates the device 100 after completing a further selective epitaxial growth process in which a further semiconductor alloy 151B may be formed in or above the active region 102B. To this end, well-established deposition recipes may be applied in order to form the material 151B so as to have the desired characteristics. In some illustrative embodiments, the material 151B may include a phosphorous species in combination with silicon, wherein a concentration of the phosphorous species may be at least 0.5 atomic percent or higher. In this case, superior electronic characteristics, for instance with respect to overall conductivity, may be obtained since the phosphorous species may also act as an efficient dopant material. In some illustrative embodiments, the material 151B may be formed on the active region 102B, thereby providing a raised drain and source configuration without requiring the formation of the cavities 106. In other cases, the material 151B may be formed in the cavities 106 so as to extend to a desired height level wherein, if desired, a different material composition may be implemented along the entire thickness of the material 151B. For example, a silicon/phosphorous material may be implemented in the cavities 106 in order to obtain a certain tensile strain component due to the reduced covalent radius of phosphorous compared to silicon. In other cases, a more efficient strain-inducing effect may be obtained by additionally or alternatively incorporating a carbon species within the cavities 106, while at a certain height a silicon/phosphorous material composition may then be deposited.

As described above, integrity of the gate electrode structure 160B may be preserved by the cap layer 164 and the spacer 105B, while the gate electrode structure 160A and the active region 102A is still reliably covered by the preserved portion of the mask layer 105. Thereafter, the mask layer 105, possibly in combination with the spacer 105B, possibly in combination with the spacer 103A, if still in place, may be removed on the basis of any highly selective etch recipe.

Figure 1H:
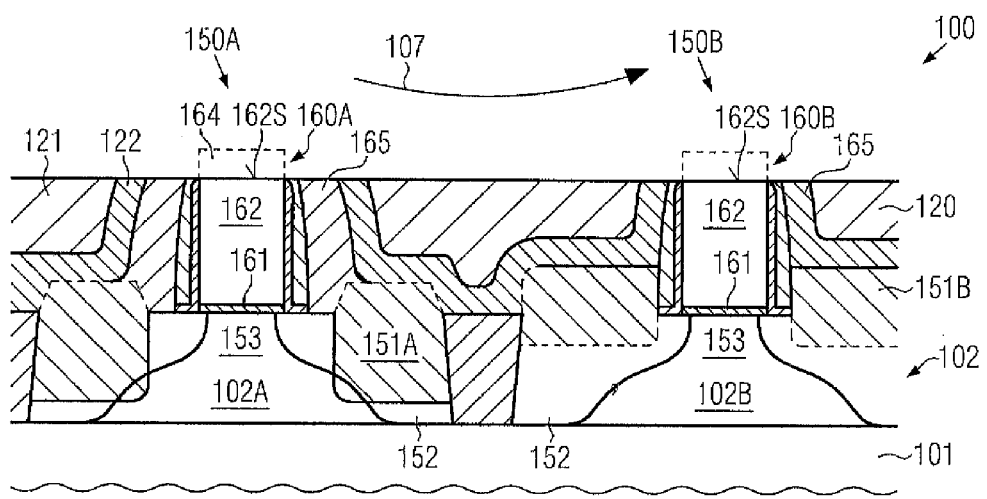

FIG. 1h schematically illustrates the device 100 in a further advanced manufacturing stage. As illustrated, the gate electrode structures 160A, 160B may have a further spacer structure 165, for instance made of silicon nitride, silicon dioxide and the like, so as to provide superior encapsulation of the material 162 and also to provide an appropriate masking effect during any implantation processes, if any such processes may be required for forming drain and source regions 152 having a desired lateral and vertical dopant profile. The drain and source regions 152 in combination with the semiconductor alloy 151A thus provide the desired electronic characteristics of a transistor 150A, while the drain and source regions 152 in combination with the material 151B may provide the desired characteristics of a transistor 150B. As previously indicated, the transistors 150A, 150B may represent complementary transistors so that the drain and source regions 152 of these transistors are of inverse conductivity types.

Moreover, an interlayer dielectric material 120 may be provided so as to laterally enclose the gate electrode structures 160A, 160B and thus passivate the transistors 150A, 150B during the further processing. The dielectric material 120 may have two or more individual material layers such as layers 122, for instance provided in the form of a silicon nitride material, and a layer 121, such as a silicon dioxide layer and the like.

The device 100 as shown in FIG. 1h may be formed on the basis of the following process strategies. After providing the material 151B and the removal of the layer 105 (FIG. 1g), the drain and source regions 152 in combination with the spacer structure 165 may be implemented by using any appropriate process regime. For example, sophisticated implantation techniques may be applied in combination with associated masking strategies. After the incorporation of any required dopant species, the final dopant profile may be established, for instance by performing one or more anneal processes, if required for activating the dopant species and for re-crystallizing implantation-induced damage. Thereafter, in some cases (not shown), a metal silicide may be formed in the drain and source regions 152, while in other cases the processing may continue by depositing the dielectric layer 120, which may be accomplished by CVD, spin-on techniques and the like. Thereafter, the resulting surface may be planarized by applying a removal process 107, which may use a CMP process and the like. At a final phase of the removal process 107, also the cap layers 164 may be exposed and may finally be removed, thereby exposing a surface 162S of the placeholder materials 162. As discussed above, due to the superior uniformity of the cap layers 164 in the transistors 150A, 150B, a very uniform process result may be obtained during the removal process 107 without requiring excessive overpolish times, which may otherwise introduce additional process-related non-uniformities.

In other illustrative embodiments (not shown), the processing may continue by patterning the dielectric layer 120 in the presence of the cap layers 164 so as to expose a portion of the drain and source regions 152 in the transistors 150A, 150B in order to form self-aligned contact elements which connect to the drain and source regions 152, wherein, if desired, a metal silicide may also be provided in order to further reduce the overall series resistance of the transistors 150A, 150B. Thereafter, processing may be continued by performing the removal process 107 so as to remove the remaining cap layers 164 in order to expose the surfaces 162S, as discussed above.

Figure 1I:
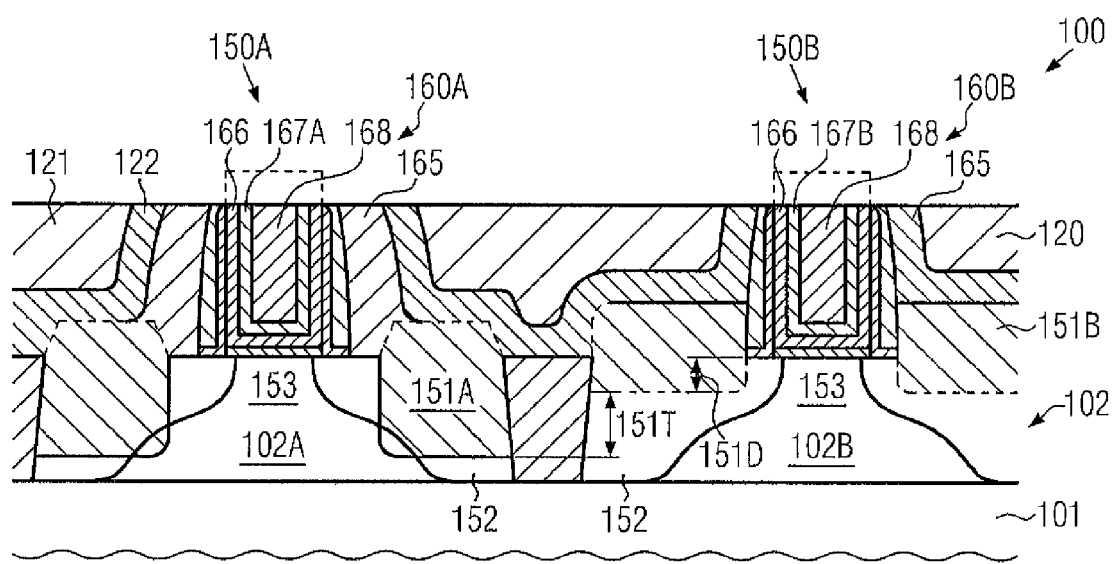

FIG. 1i schematically illustrates the device 100 in a further advanced manufacturing stage. As shown, a replacement gate approach may be applied in order to provide the gate electrode structures 160A, 160B with superior electronic characteristics. To this end, in some illustrative embodiments, upon exposing the placeholder material 162 (FIG. 1h), well-established highly selective etch recipes may be applied so as to remove the polysilicon material, possibly in combination with any underlying dielectric material, followed by a further regrowth of an oxide material, if required, and followed by the deposition of a high-k dielectric material 166. Thereafter, appropriate process strategies may be applied in order to deposit work function metals, such as lanthanum, aluminum and the like, possibly in combination with materials such as titanium nitride, tantalum nitride and the like, as required for adjusting an appropriate work function for the gate electrode structures 160A, 160B, respectively. For example, materials or material systems 167A, 167B may be deposited and appropriately patterned, if required, followed by a further deposition of an electrode metal 168, such as aluminum, aluminum alloys and the like, which may be accomplished on the basis of any appropriate deposition techniques. Thereafter, any excess material may be removed, for instance by CMP. Prior to or after the removal of any excess material, additional thermal treatments may be performed so as to thermally stabilize the gate electrode structures 160A, 160B and also initiate a desired diffusion of the work function metal species.

As a result, the present disclosure provides semiconductor devices and manufacturing techniques in which semiconductor alloys may be provided for N-channel transistors and P-channel transistors on the basis of individually patterned hard mask layers, which provide superior uniformity during the further processing, and in particular during a replacement gate approach. Consequently, performance of P-channel transistors and N-channel transistors may be individually finely tuned on the basis of a corresponding semiconductor alloy, which in some illustrative embodiments may be provided for P-channel transistors in the form of a strain-inducing semiconductor material extending to a desired depth 151T, while the N-channel transistor receives an appropriate semiconductor alloy for enhancing performance, for instance by incorporating phosphorous, wherein, if desired, individually adjusted depth may be applied. In some illustrative embodiments, a depth 151D of the semiconductor alloy formed in the N-channel transistor may be less than the corresponding depth 151T of the strain-inducing semiconductor alloy. It should be appreciated that the above-described process sequence may also be applied in reverse order with respect to providing the semiconductor alloys 151A, 151B without negatively affecting the overall superior uniformity of the resulting transistors 150A, 150B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A method, comprising:
    forming a first gate electrode structure on a first active region of a semiconductor device and a second gate electrode structure on a second active region of said semiconductor device, said first and second gate electrode structures each comprising a gate electrode material and a dielectric cap layer formed above said gate electrode material;
    forming a sidewall spacer structure adjacent to sidewalls of at least said first gate electrode structure, said sidewall spacer structure comprising a spacer element and a liner layer formed between said spacer element and said sidewalls of said first gate electrode structure;
    forming a first hard mask layer above said first and second gate electrode structures;
    forming a first spacer structure from said first hard mask layer adjacent to said sidewalls of said first gate electrode structure while preserving said first hard mask layer above said second gate electrode structure and said second active region, said first spacer structure covering said spacer element of said sidewall spacer structure;
    forming a first semiconductor alloy in said first active region by using said first spacer structure and said preserved first hard mask layer as a first mask;

forming a second hard mask layer above said first and second gate electrode structures and said first and second active regions;

forming a second spacer structure from said second hard mask layer adjacent to sidewalls of said second gate electrode structure while preserving said second hard mask layer above said first gate electrode structure and said first active region; and forming a second semiconductor alloy in said second active region by using said second spacer structure and said preserved second hard mask layer as a second mask.

2. The method of claim 1, wherein said gate electrode material is a placeholder material, the method further comprising removing an entirety of said placeholder material of said first and second gate electrode structures and replacing said placeholder material with at least a metal-containing electrode material.

3. The method of claim 1, wherein forming said first and second hard mask layers comprises forming said first and second hard mask layers as silicon and oxygen containing layers.

4. The method of claim 1, further comprising forming said dielectric cap layer of said first and second gate electrode structures so as to have a material composition that differs from a material composition of said first and second hard mask layers.

5. The method of claim 1, wherein forming said first semiconductor alloy comprises forming a cavity in said first active region and selectively depositing said first semiconductor alloy at least in said cavity.

6. The method of claim 5, wherein depositing said first semiconductor alloy comprises forming said first semiconductor alloy in a strained state.

7. The method of claim 6, wherein forming said first semiconductor alloy comprises forming said first semiconductor alloy so as to comprise at least one of silicon, germanium and tin.

8. The method of claim 1, wherein forming said second semiconductor alloy comprises forming a phosphorus containing material.

9. The method of claim 8, wherein forming said second semiconductor alloy further comprises forming a recess in said second active region and depositing said second semiconductor alloy into said recess.

10. The method of claim 2, wherein replacing said placeholder material of said first and second gate electrode structures comprises forming a dielectric material above said first and second gate electrode structures and said first and second active regions and performing a removal process so as to remove an excess portion of said dielectric material and removing said dielectric cap layer from said first and second gate electrode structures during a common material removal process so as to expose said placeholder material.

11. A method of forming a semiconductor device, the method comprising:

forming a first gate electrode structure above a first semiconductor region and a second gate electrode structure above a second semiconductor region, said first and second gate electrode structures each comprising a placeholder electrode material and a dielectric cap layer;

forming a sidewall spacer structure adjacent to sidewalls of each of said first and second gate electrode structures, each of said sidewall spacer structures comprising a spacer element and a liner layer formed between said spacer element and said sidewalls of said respective first and second gate electrode structures;

forming a strain-inducing semiconductor material in said first semiconductor region while masking said second semiconductor region and said spacer element of said first gate electrode structure with a first hard mask layer;

removing said first hard mask layer from above at least a portion of said second semiconductor region;

forming a semiconductor alloy on said second semiconductor region while masking said first semiconductor region and a portion of said second gate electrode structure with a second hard mask layer; and replacing an entirety of said placeholder electrode material of said first and second gate electrode structures at least with a metal-containing electrode material.

12. The method of claim 11, wherein masking said second semiconductor region and said spacer element of said first gate electrode structure comprises forming a first mask material above said first and second semiconductor regions and removing a portion of said first mask material selectively from above said first semiconductor region by performing an etch process and using said dielectric cap layer as an etch stop material.

13. The method of claim 12, wherein forming said first mask material comprises forming a silicon dioxide material.

14. The method of claim 11, wherein masking said first semiconductor region and a portion of said second gate electrode structure comprises forming a second mask material above said first and second semiconductor regions and removing a portion of said second mask material selectively from above said second semiconductor region by performing an etch process and using said dielectric cap layer as an etch stop material.

15. The method of claim 11, wherein said dielectric cap layer and said sidewall spacer structure are comprised of silicon nitride.

16. The method of claim 11, wherein forming said strain-inducing semiconductor material comprises selectively depositing a material that comprises at least one of silicon, germanium and tin.

17. The method of claim 11, wherein forming a semiconductor alloy on said second semiconductor region comprises forming a silicon and phosphorus containing alloy.

18. The method of claim 1, wherein said first and second hard mask layers are formed on and in direct contact with at least said dielectric cap layer of said first and second gate electrode structures.

19. The method of claim 1, wherein forming said liner layer comprises performing an oxidation process, said liner layer covering sidewalls of said gate electrode material and exposing sidewalls of said dielectric cap layer.

20. The method of claim 11, wherein forming said strain-inducing semiconductor material in said first semiconductor region comprises forming a first recess having a first depth adjacent to said first gate electrode structure and wherein forming said semiconductor alloy on said second semiconductor region comprises forming a second recess having a second depth adjacent to said second gate electrode structure, said second depth being different than said first depth.

21. The method of claim 11, wherein forming said second semiconductor alloy on said second semiconductor region comprises forming said second semiconductor alloy on an upper surface of said second semiconductor region, said upper surface being defined by an interface between a gate dielectric layer below said second gate electrode structure and a channel region below said gate dielectric layer.

22. The method of claim 12, wherein said first mask material is formed on and in direct contact with said dielectric cap layer of at least one of said first and second gate electrode structures.

23. The method of claim 14, wherein said second mask material is formed on and in direct contact with said dielectric cap layer of at least one of said first and second gate electrode structures.

24. The method of claim 1, wherein forming said second spacer structure comprises exposing an upper surface of said dielectric cap layer of said second gate electrode structure.

* * * * *